United States Patent [19]
Adams et al.

[11] Patent Number: 5,801,512
[45] Date of Patent: Sep. 1, 1998

[54] METHOD AND APPARATUS FOR PROVIDING SUPPLEMENTAL PHOTOELECTRIC CHARGE TO COMMUNICATION DEVICES

[75] Inventors: Arthur Henry Adams, 29486 Quail Run Dr., Agoura Hills, Calif. 91301; W. Parke Cole, Malibu, Calif.

[73] Assignee: Arthur Henry Adams, Agoura Hills, Calif.

[21] Appl. No.: 476,234

[22] Filed: Jun. 7, 1995

[51] Int. Cl.⁶ ................................................ H01M 10/46
[52] U.S. Cl. ........................................ 320/61; 136/292
[58] Field of Search ............................ 320/21, 2, 5, 61; 136/243, 244, 292

[56] References Cited

U.S. PATENT DOCUMENTS

| | | |
|---|---|---|
| 3,028,488 | 4/1962 | Hudspeth et al. . |
| 4,200,904 | 4/1980 | Doan . |
| 4,788,711 | 11/1988 | Nasco, Jr. . |
| 5,365,159 | 11/1994 | Chen .................... 320/2 X |
| 5,503,684 | 4/1996 | Duran .................... 136/251 |

FOREIGN PATENT DOCUMENTS

| | | |
|---|---|---|
| 3314251 | 10/1984 | Germany ................ 320/2 |

*Primary Examiner*—Edward Tso
*Attorney, Agent, or Firm*—Philip T. Virga

[57] ABSTRACT

A method and apparatus for providing additional charging power by means of natural and man made surrounding light sources to a communication device comprises a generally square frame member defining a front and second side, the first side of the frame member having embedded a plurality of photo-voltaic cells and the second side housing an adhesive for attachment to the second side of the communication device. The photo-voltaic cells are interconnected to each other and attached to an electrically thin ribbon wire which protrudes through the second side of the frame member. At the end of the ribbon wire is an applicator for attaching the ribbon wire into a battery plug socket located within the communication device's battery compartment. The first side of the frame member also houses a light emitting diode (LED) electrically connected between the plurality of photo-voltaic cells and the ribbon wire to indicate if auxiliary photoelectric charge is being provided to the communication devices battery. Additionally, the LED functions as a back-flow preventer to ensure that the phone's battery does not discharge itself when the photo-voltaic cells are not in use.

14 Claims, 12 Drawing Sheets

METHOD AND APPARATUS FOR PROVIDING SUPPLEMENTAL PHOTOELECTRIC CHARGE TO COMMUNICATION DEVICES

BACKGROUND OF THE INVENTION

The present invention relates to a method and apparatus for adapting a communication device to receive supplemental photoelectric charge. In particular, the present invention relates to enhancing the features of a communication device by attaching a photo-voltaic panel to the communication device wherein the charge received from the photo-voltaic panel trickle charges the communication device's batteries.

It is well known that communication devices are powered by rechargeable nickel cadmium or nickel hydride batteries. These devices are conventionally charged by an alternating current base station with a cradle that receives the handheld unit. However, these devices have the drawback that their usefulness is limited by the amount of battery charge that they hold. One type of common problem associated with communication devices is that the users forget to return the handset to the charger at night resulting in the device being in a discharged state and temporarily not able to be used.

Therefore, there is a need for a method and apparatus which provides a photoelectric charged system for enhancing the length of time between battery charges in a conventional communication device than is ordinarily obtainable between the base station charges.

The subject invention herein solves all of these problems in a new and unique manner which has not been part of the art previously. Some related patents are described below:

U.S. Pat. No. 4,200,904 issued to D. Doan, on Apr. 29, 1980

This patent is directed to a solar powered street lighting system that is totally independent of any external power supply. The system provides solar powered panels arranged and connected in such a manner as to charge a maintenance-free storage battery with sufficient capacity to light street lights and/or traffic signals.

U.S. Pat. No. 4,788,711 issued to M. Nasco on Nov. 29, 1988

This patent is directed to a self-contained cellular emergency roadside call box. The call box is solar powered with battery storage and comprises a controller coupled to a cellular transceiver. Additionally, the controller is coupled to a solar array and battery which is recharged through the controller.

U.S. Pat. No. 5,365,159 issued to S. Chen on Nov. 15, 1994

This patent is directed to a battery-charger with adjustable contacts which may be specifically arranged according to specific positions of power contacts of different types of batteries. The battery-charger comprises a base body on which a battery to be charged is placed, a contact-adjusting member disposed on the base body and a set of conductive contacts fitted in the contact-adjusting member in accordance with the positions of power contacts of the battery.

While the basic concepts presented in the aforementioned patents are desirable, none of the apparatus employed by each provide a photoelectric charge assembly that is easily retrofited into conventional communication devices which produces a power boost to the devices battery that allows a user to enjoy up to twice the amount of use between base station charges.

SUMMARY OF THE INVENTION

A method and apparatus for providing supplemental photoelectric charge to a communication device comprising a generally square frame member having a first and second side, the first side of the frame member having embedded a plurality of shingled photo-voltaic cells and the second side housing a double sided adhesive for attachment to the communication device. The photo-voltaic cells provide a charging circuit and are interconnected to each other in series and attached to an electrical ribbon wire which protrudes through the second side of the frame member. At the end of the ribbon wire is an applicator for inserting and connecting the ribbon wire into a battery plug socket located within the communication device's battery compartment.

Additionally, the first side of the frame member houses a light emitting diode (LED) electrically connected between the plurality of photo-voltaic cells and the ribbon wire to indicate if supplemental photoelectric charge is being provided to the communication devices battery. Also, the LED functions as a backflow preventer to ensure that the communication device's battery does not discharge itself when the photo-voltaic cells are not in use.

In use, the communication device's battery cover is slid back and the battery plug is removed from its socket. Next, the applicator with the ribbon wire attached to it is inserted and electrically connected into the battery plug socket and the applicator is withdrawn with the ribbon wire affixed. The battery plug is then reinserted into the socket with the excess ribbon wire folded into the battery compartment and the battery compartment cover is closed against the ribbon wire being sufficiently thin so as not to impede the closing of the battery cover. When the photo-voltaic cells are in the presence of a light source the battery receives an additional trickle charge resulting in longer use times between charging periods.

Another object of the present invention is to provide the communication device user with up to twice the amount of usage time before returning the device to its base station for recharging.

Yet, still another object of the present invention is to have a communication device that will receive a charge in any light medium such as sunlight, incandescent light, fluorescent light.

Still, yet another object of the present invention is to provide a method of keeping communication device batteries at full charge thereby avoiding cycles of deep discharge and extending the life of the batteries resulting in saving the consumer the cost of battery replacement and protection of the environment by delaying the batteries going into landfills.

Still, yet another object of the present invention is to use photoelectric charged energy resulting in less grid generated electricity used in recharging the batteries and thus saving nationwide energy costs.

Accordingly, it is an object of the present invention to provide a method and apparatus for providing photoelectric charge energy to a variety of handheld battery powered electronic communication devices which is easy to manufacture, low in cost and in certain circumstances may result in lives being saved.

BRIEF DESCRIPTION OF THE DRAWINGS

The above, as well as other, advantages of the present invention will become readily apparent to those skilled in the art from the following detailed descriptions of the preferred embodiment when considered in light of the accompanying drawings in which.

DESCRIPTION OF THE PREFERRED EMBODIMENTS

Figure 1:
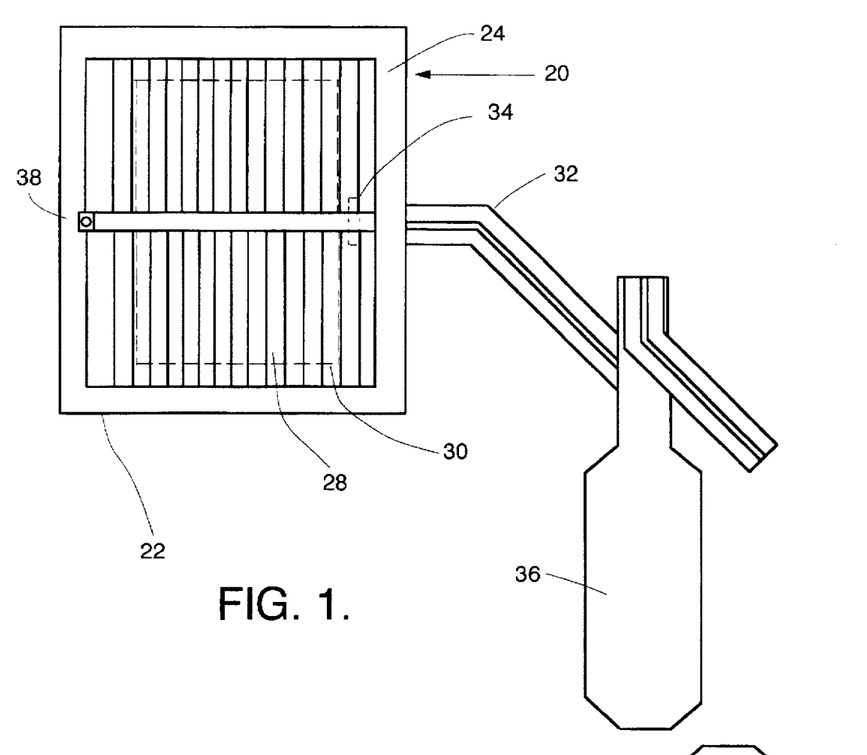
FIG. 1 is a front plan view of a photoelectric charge assembly constructed in accordance with the present invention.
Figure 2:
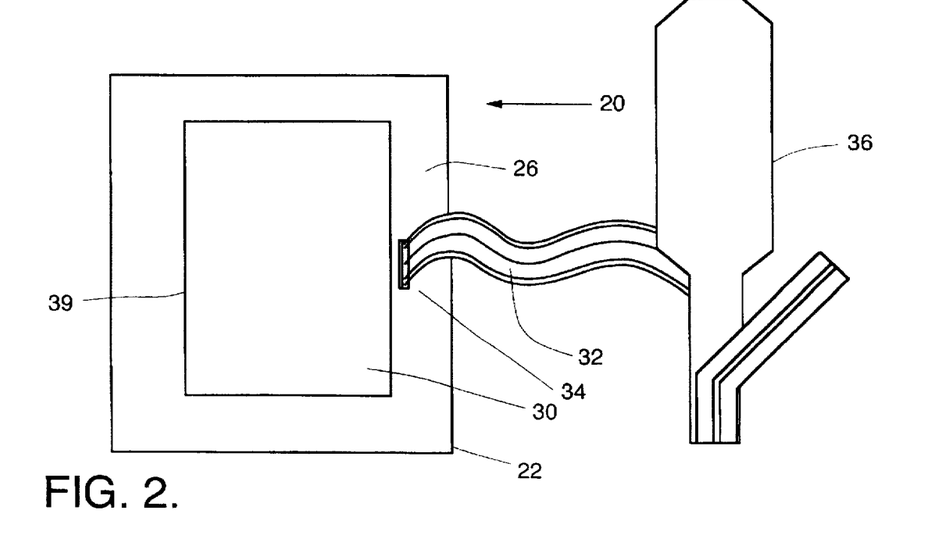
FIG. 2 is a back plan view of the photoelectric charge assembly of FIG. 1.

Referring now to the drawings wherein like reference numerals refer to like and corresponding parts throughout, the apparatus for providing auxiliary photoelectric charge to a communication device is generally indicated by numeral 20. Referring now to the drawings, and more particularly to FIGS. 1 and 2, the apparatus 20 comprises a generally square frame member 22 defining first and second sides, 24 and 26. On the first side 24 of the frame member 22 has embedded in it a plurality of photo-voltaic cells 28 which are electrically connected to each other by solder or any electrical connection means known in the attachment arts and in the preferred embodiment may be shingled together. Referring to FIG. 2, on the second side 26 of frame member 22 is a indentation 39 which houses an adhesive 30 for attachment to the second side of the communication device, as will be more fully described below.

Referring once again to FIGS. 1 and 2, the plurality of photo-voltaic cells 28 are attached to an electrical ribbon wire 32 which protrudes through an aperture 34 located on the second side 26 of frame member 22. At the end of the ribbon wire 32 is an applicator 36 for attaching the ribbon wire 32 into a battery plug socket 48 located within the communication device's battery compartment 52 as will be more fully shown and detailed below. Referring to FIG. 1, the first side 24 of frame member 22 houses a light emitting diode (LED) 38 which is electrically connected between the plurality of photo-voltaic cells 28 and the ribbon wire 32 to indicate if auxiliary photoelectric charge is being transmitted through the ribbon wire 32 to the communication device's battery. Also, the LED 38 functions as a backflow preventer to ensure that the phone's battery does not discharge itself when the photo-voltaic cells are not in use.

In the preferred embodiment, the photoelectric cells 28 are electrically connected in parallel and series and may be shiplaped on each other in such a way that the positive side and negative bottom side of each of the solder cells 28 may be solder or electrically connected together. A clear acrylic is then potted over the photoelectric cells 28 to provide a light permeable but sufficiently tough cover to protect the cells 28. The LED 38 is located in series in the above described circuit and housed in a slot in the middle of any side of the frame member 22, and as mentioned before prevents the reverse flow of current when no light is energizing the photo-voltaic cells 28.

Figure 3:
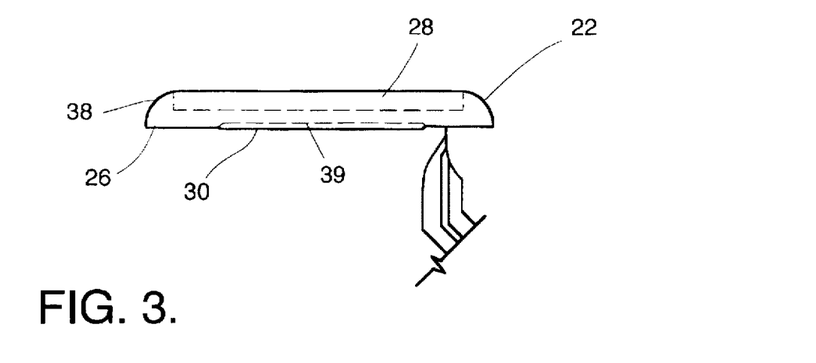
FIG. 3 is a side elevational view of the photoelectric charge assembly of FIG. 1.
Figure 5:
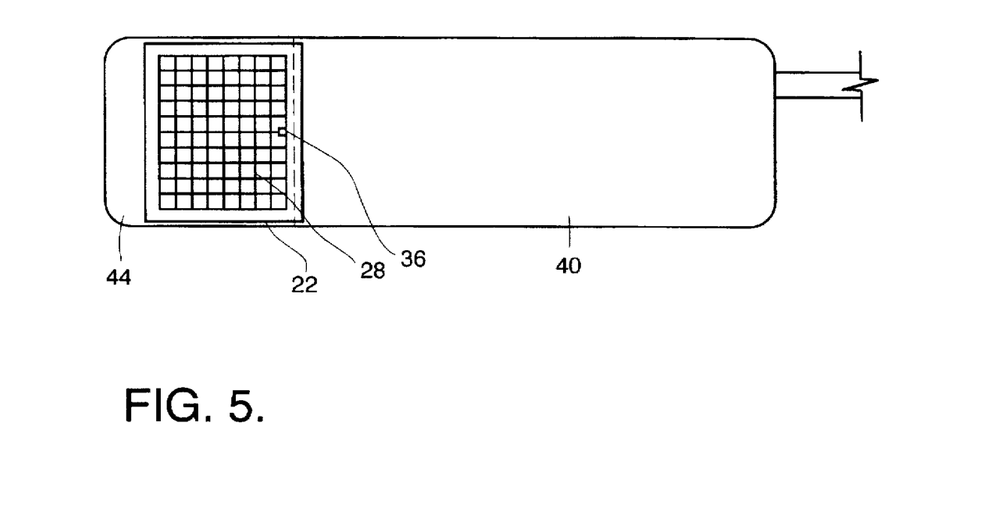
FIG. 5 is a back plan view of the photoelectric charge assembly of FIG. 1 installed onto a communication device.
Figure 6A:
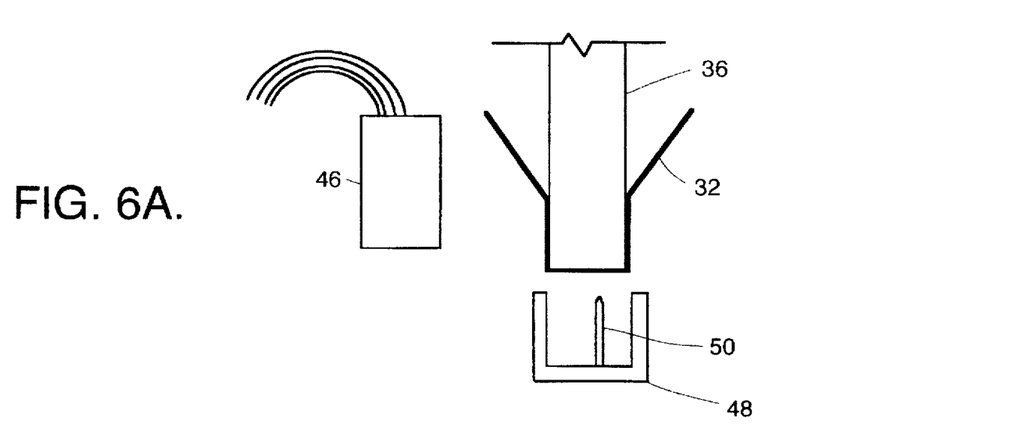
FIGS. 6A–6D shows the installation procedure for connecting the ribbon wire into the battery plug socket in accordance with the method of the present invention.
Figure 6B:
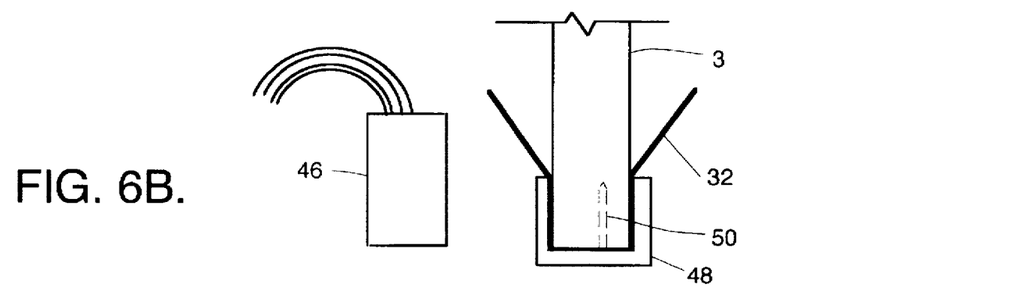
Figure 6C:
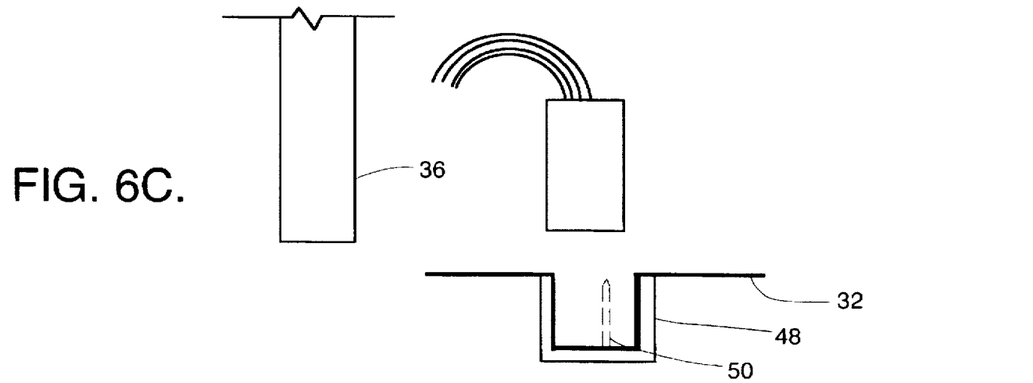
Figure 6D:
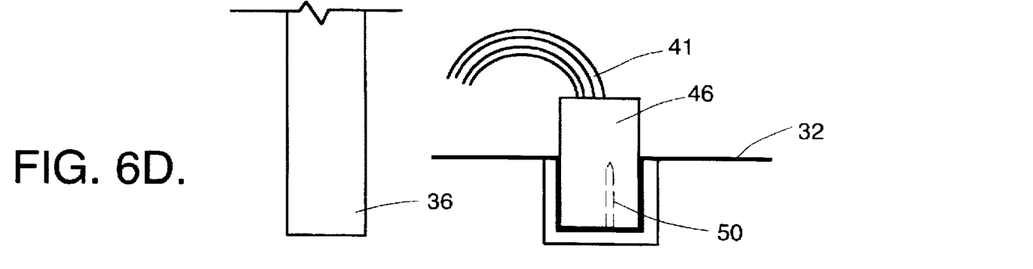
Figure 7:
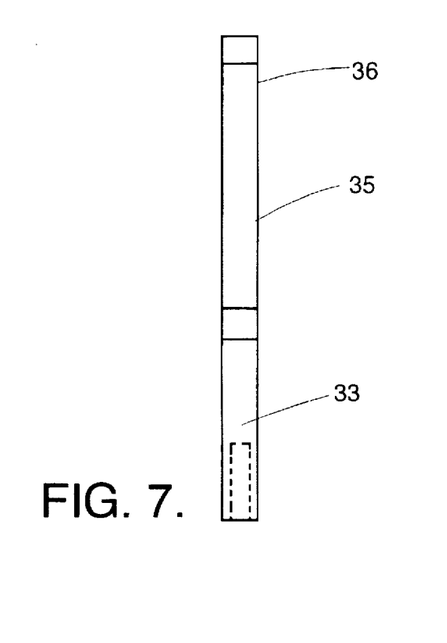
FIG. 7 shows a side view of an applicator in accordance with the present invention.
Figure 8:
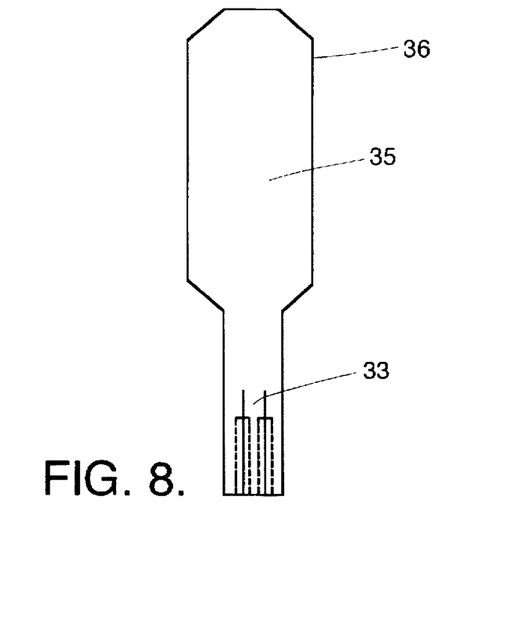
FIG. 8 shows a top view of the applicator of FIG. 7.
Figure 9:
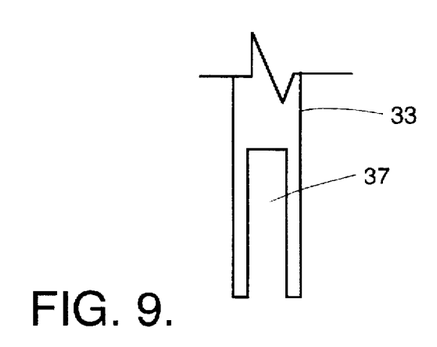
FIG. 9 shows a side end section view of the applicator of FIG. 7.
Figure 10:
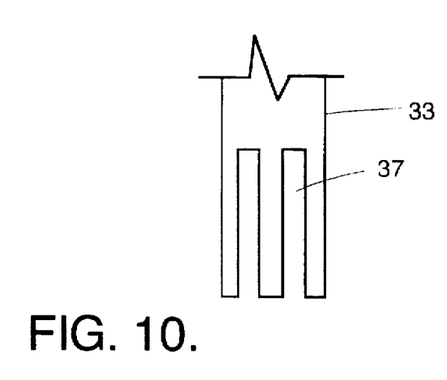
FIG. 10 shows a top end section view of the applicator of FIG. 7.
Figure 11:
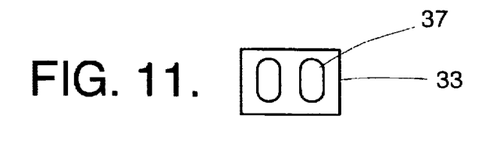
FIG. 11 shows an end section view of the applicator of FIG. 7.

The frame member 22 may be manufactured from an injection molded body using any variety of polyproplyene, polystyrene or ABS materials of sufficient rigidity and having lightness of weight and resistance to light degradation characteristics. Referring now to FIG. 3, the second side 26 of frame member 22 is undercut to define a indentation 39 which in the preferred embodiment is one 32nd of an inch around its circumference. Attached to this undercut indentation 39 is housed the adhesive 30 which in the preferred embodiment is a double sided foam covered tape, 1/16 inch in thickness, 1 inch wide by 1 and 1/2 inches long, and after the tape cover is peeled off, it is adhered to the back of communication device 40 as shown in FIG. 5.

As mentioned before, after the photo-voltaic cells 28 are connected and placed within the body 22 a clear acrylic potting resin is poured into the cavity thus sealing, protecting and covering all parts. The LED 38 is placed at the bottom of the body 22 and after series connection to the photo-voltaic cells 28 is partially potted within the body 22. The LED 38 protrudes slightly, approximately 1/32 of an inch above the level of the body 22 potting material.

Figure 4:
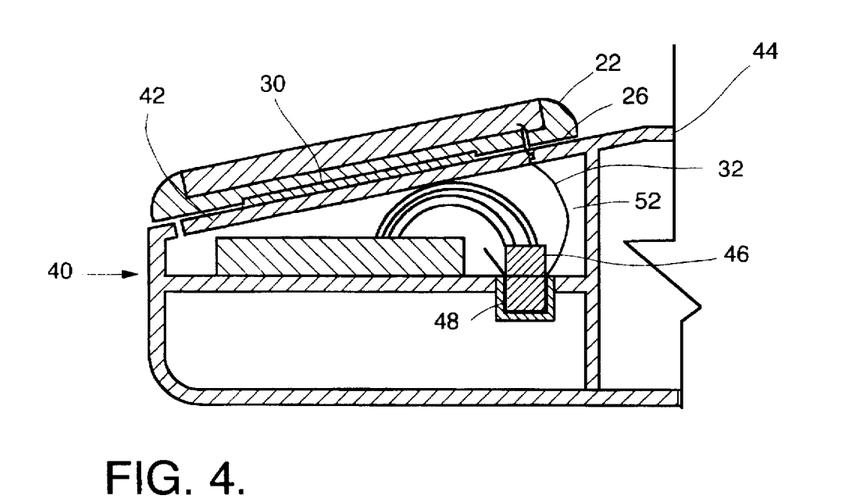
FIG. 4 is a side elevational view of the photoelectric charge assembly of FIG. 1 installed into a communication device.

Turning now to FIG. 4, Exiting from the second side 26 of frame member 22 is the ribbon wire 32 which carries the positive and negative aspects of the electric charging circuit. In the preferred embodiment the ribbon wire 32 is approximately four (4) inches long after coming out of the body 22 and is 3 to 4 mills in thickness, 0.2187 inches wide having 0.090 inch wide conductors of 1 to 2 mills in thickness. The conductors are 1/4 tempered copper tinned for easy soldering and then adhered and insulated by a 1 mill polyester backing.

Referring now to FIGS. 7 through 11, at the end of ribbon wire 32 is an injection molded plastic applicator 36 having a handle 35 sized so as to be easily handled by a persons fingers. The end 33 of the applicator 36 is sized and configured such that it will fit into the battery plug socket 48 and contains two oblong holes 37 to accept the battery socket prongs 50 such that they will exactly pierce the ribbon wire, as shown in FIGS. 6A through 6D. The ribbon wire 32 is preplaced and affixed to the applicator 36 by an adhesive tape with an easy pull tag to release the applicator 36 from the ribbon 32 after insertion into the communication device 40. In the preferred embodiment, one conductor of the ribbon 32 is colored red to indicate a positive lead and for easy matching to the battery socket 48.

As mentioned before and shown in FIGS. 4 and 5, in use the communication device's battery cover 42 is slid back and the battery plug 46 is removed from its socket 48 for installation of ribbon wire 32. Next, the double sided adhesive 30 is exposed by taking off the paper covering and then affixed to the battery cover 42 located on a side 44 of any communication device 40. Although not shown it should be envisioned that on some communication devices 40 the frame member 22 and adhesive 30 will be affixed in a sideways position due to the narrowness of the frame member 22.

FIGS. 6A through 6D shows the installation of the ribbon wire 32 in accordance with the method of the present invention. First, the applicator 36, with the ribbon wire 32 attached to it, is inserted and electrically connected into the battery plug socket 48 in such a way that the two conductor wire 32 is pierced by the two prongs 50 that reside within the battery plug socket 48. The applicator 36 is then withdrawn wherein the ribbon wire 32 will stay affixed within the battery plug socket 48 in electrical contact with prongs 50. The battery plug 46 is then reinserted into the socket 48 with the excess ribbon wire 32 folded into the battery compartment 52, as shown in FIG. 4. The battery compartment cover 42 is closed against the ribbon wire 32 which as described before is sufficiently thin so as not to impede the closing of the battery cover 42.

To ensure the previously described method is accomplished successfully, the communication device 40 is put in the presence of a strong light source and checked to see if the LED 38 is lit thereby indicating that charging is now taking place. Additionally, The LED 38 also functions as a back-flow preventer stopping battery discharge when no light is charging the photo-voltaic cells 28. As may be appreciated from the description of the invention, when the photo-voltaic cells 28 are in the presence of a light source, the communication device's battery receives an additional trickle charge resulting in longer use times between charging periods.

Figure 12:
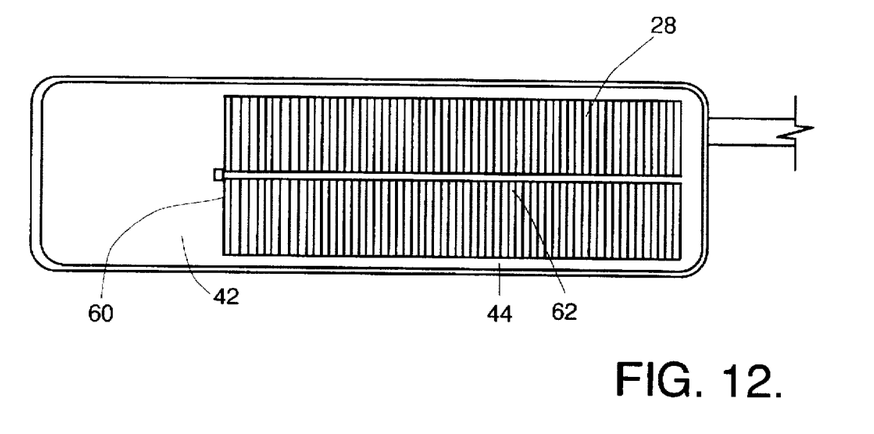
FIGS. 12–14 shows a cordless phone in use with the apparatus of the present invention.
Figure 13:
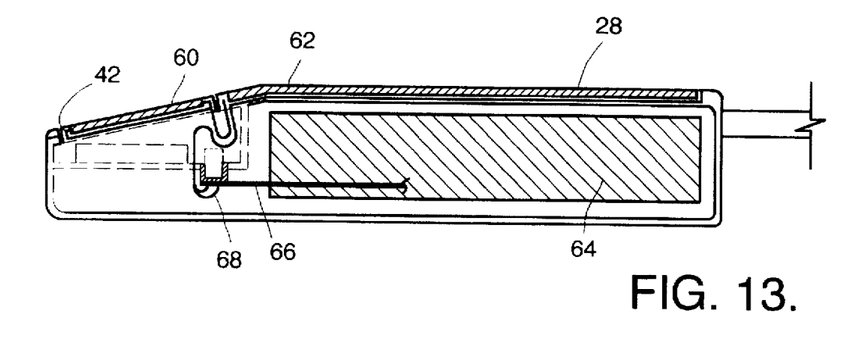
Figure 14:
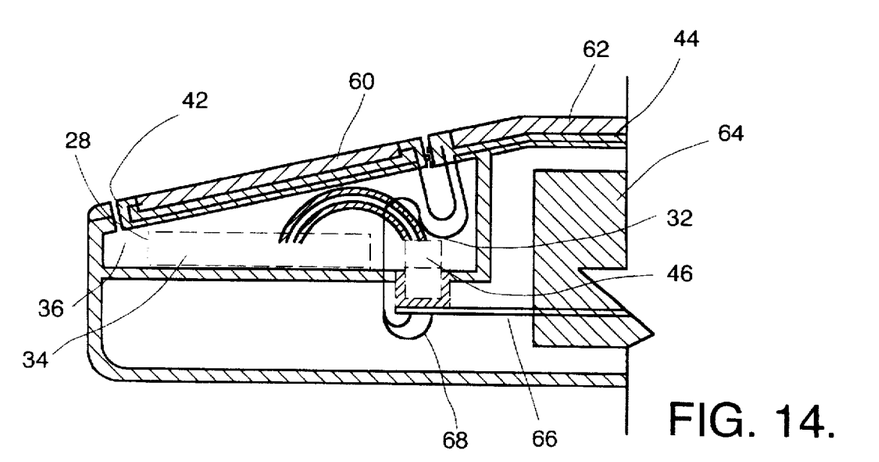
Figure 15:
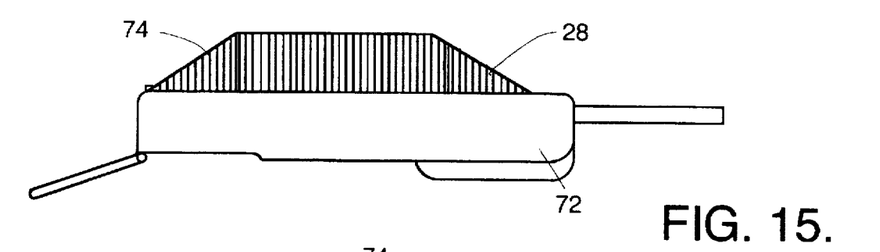
FIGS. 15–18 shows a cellular phone in use with the apparatus of the present invention.
Figure 16:
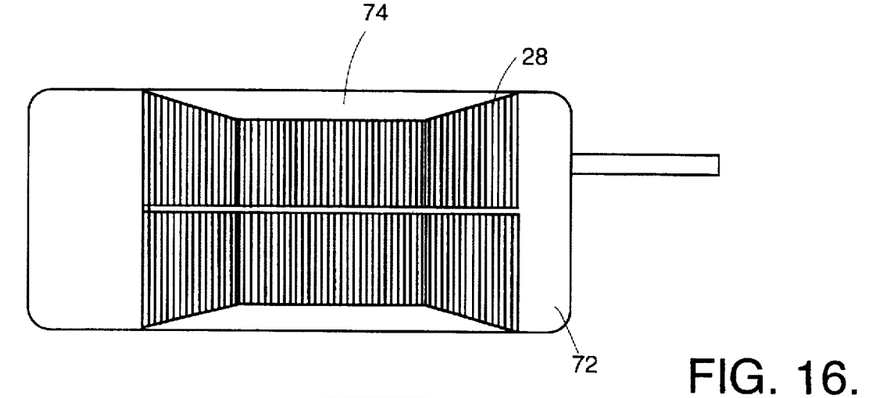
Figure 17:
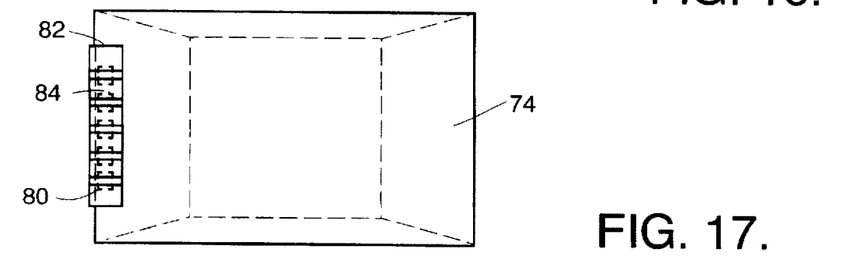
Figure 18:
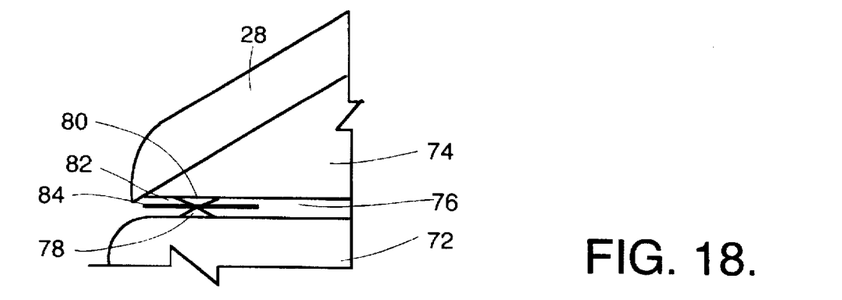
Figure 19:
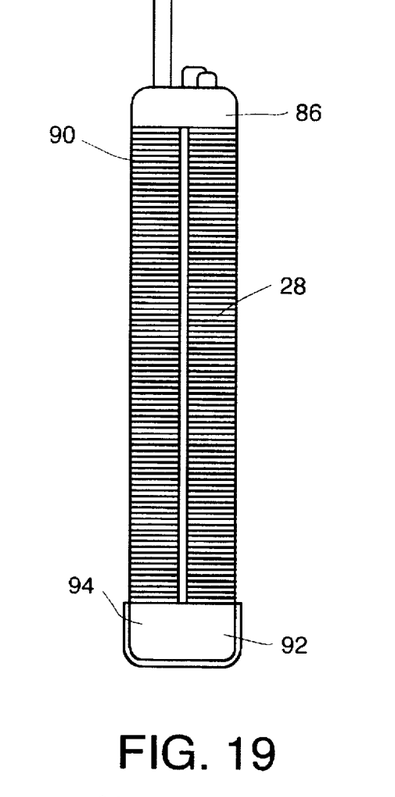
FIGS. 19–22 shows a marine transceiver in use with the apparatus of the present invention.
Figure 20:
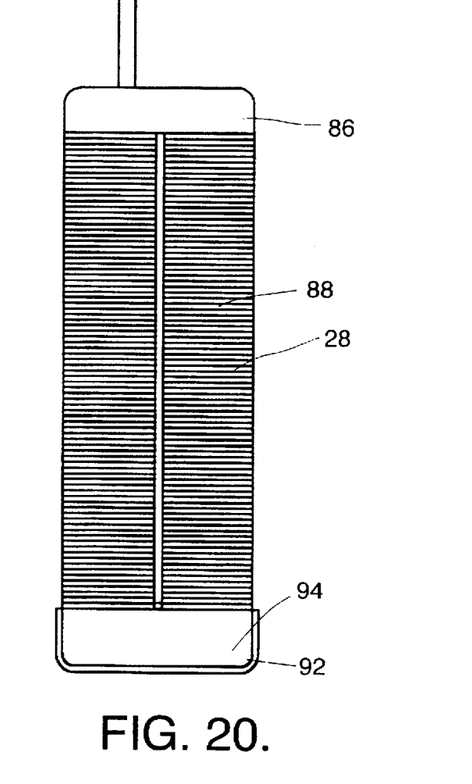
Figure 21:
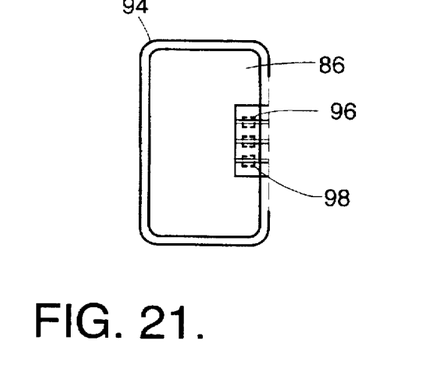
Figure 22:
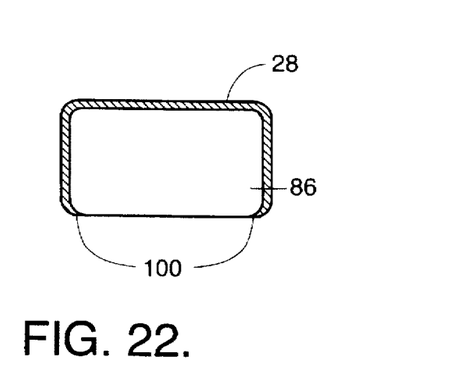
Figure 23:
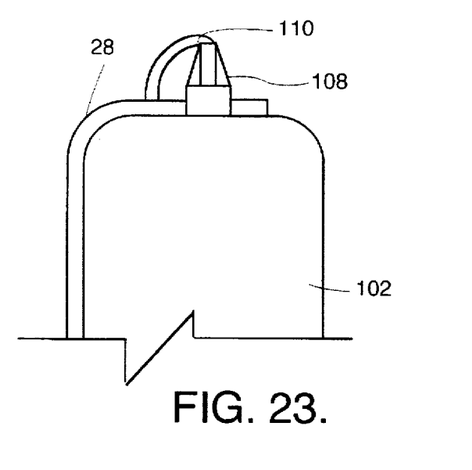
FIGS. 23–26 shows a Global Positioning System unit in use with the apparatus of the present invention.
Figure 24:
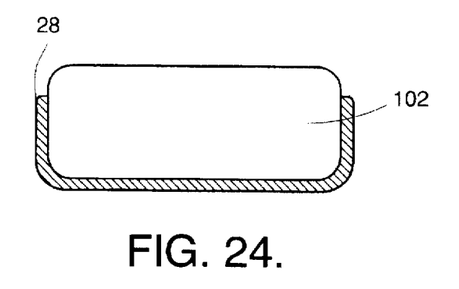
Figure 25:
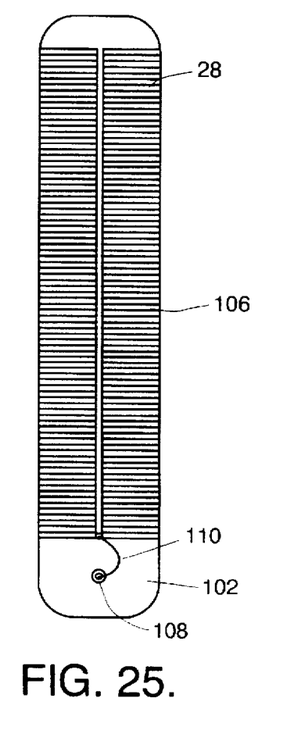
Figure 26:
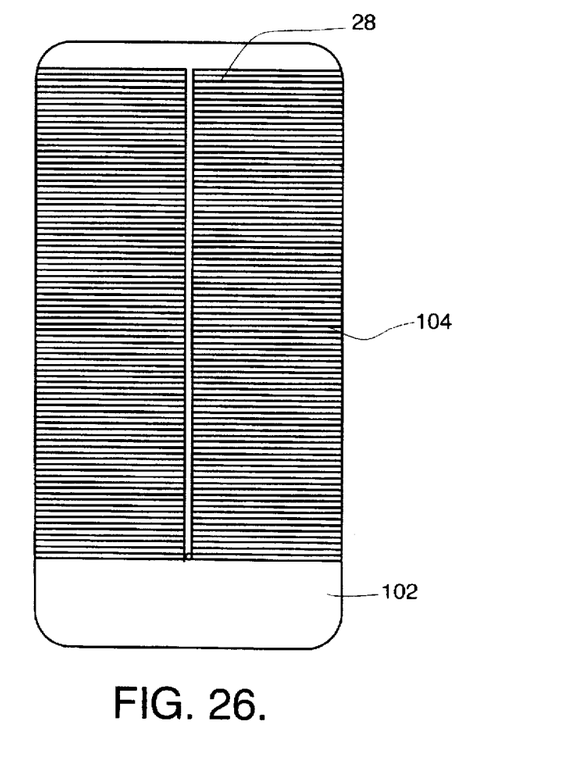
Figure 27:
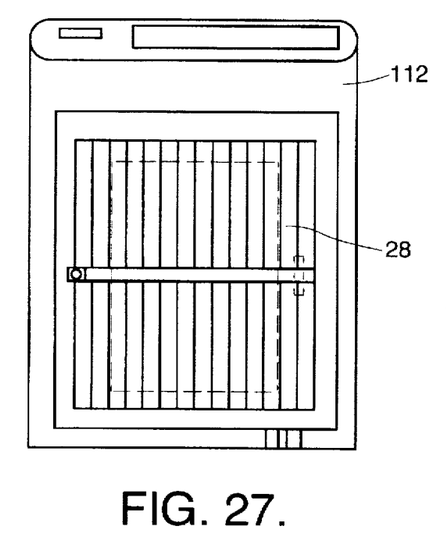
FIGS. 27–30 shows a beeper unit in use with the apparatus of the present invention.
Figure 28:
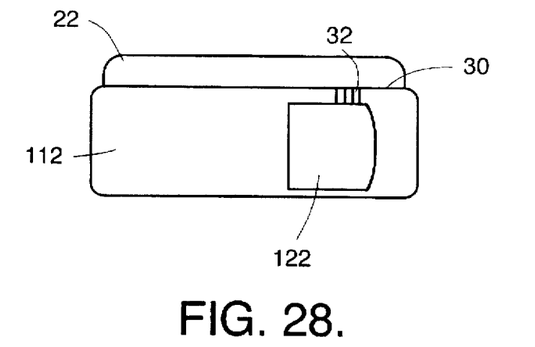
Figure 29:
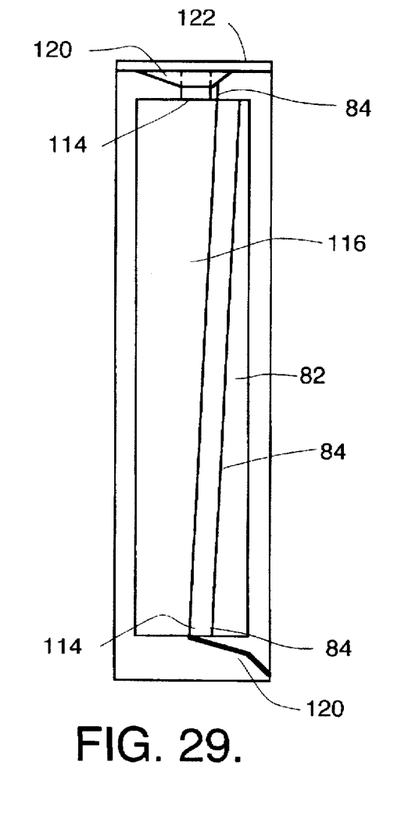
Figure 30:
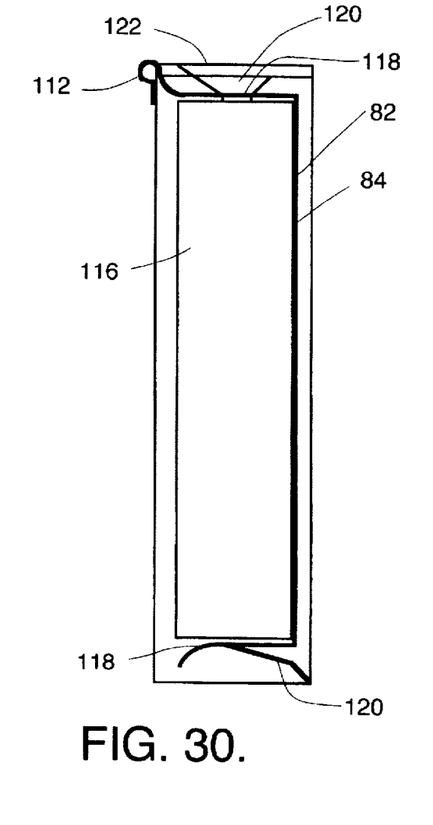

Referring to FIGS. 12 through 14, a second embodiment of the apparatus shows a solar array 60 composed of shingled photo-voltaic cells 28 approximately six inches long by three inches wide housed within a side of a cordless phone 62. It should be envisioned that the photoelectric charging panel 28 may be built into the entire back cover 60 of the phone 62. The inside 64 of the cordless phone 62 is connected to internal circuitry 66 and 68 as shown with the electrical circuitry of the invention 20 connected as previously described. Once again, to operate, the phone is placed back side up in any light source, sunlight, incandescent quartz, or fluorescent lighting, and as described above, when the LED 38 lights it indicates charging is taking place.

Referring now to FIGS. 15 through 18, in another preferred embodiment there is shown a cellular phone 72 in use with the apparatus of the present invention. The cellular phone 72 has the photo-voltaic cell 28 attached to the cellular phone battery pack 74. More specifically, the contact area 76 uses a double sided contact ribbon 84 on an adhesive backing 82 fitting between the phone contacts 78 and battery contacts 80.

In yet still another preferred embodiment, as shown in FIGS. 19 through 22 it may be envisioned that the apparatus employing the use of photo-voltaic cells 28 may be embodied as a retrofit for handheld marine transceivers. The marine transceiver 86 has the photo-voltaic cells 28 located on back 88 and sides 90 of the unit 86 snugly gripping the unit at contact points 100. More specifically, the contact scheme comprises an elastic cover 94 embedded with ribbon contacts wires 96 that fit over the end of the unit 92 and contact the transceivers charge contacts 98. The contact wire is held to the contacts 98 by the strength of the elastic cover 94 and then connected to the photo-voltaic cells 28 mounted on the transceiver 86. To operate, the transceiver is placed back or side up in any light source including sunlight, incandescent, or fluorescent light and the apparatus will indicate charging by the illumination of the built in LED. This embodiment is especially useful in that persons stranded out at sea that have their batteries go dead when they are in a dangerous situation will have the ability to have a way to charge their marine transceivers batteries gaining the ability to send an SOS to potential rescuers and literally saving their lives in the process.

Another preferred embodiment is shown in FIGS. 23 through 26 wherein it may be envisioned that the apparatus employing the use of photo-voltaic cells 28 may be embodied as a retrofit for global positioning satellite units or GPS. The GPS unit 102 has the photo-voltaic cells 28 located on the back 104 and sides 106 of the unit 102 wherein a charge plug 108 matching that of the manufacturers charge plug that attaches to the photo-voltaic cells 28 by means of a standard wire connection 110 is used.

Referring now to FIGS. 27 through 30, in another preferred embodiment there is shown a standard beeper unit 112 incorporating the photo-voltaic cells 28 in accordance with the present invention. The photo-voltaic cells 28 are located and attached by means of double sided adhesive tape 30 on the back of body 22 connected into the battery compartment 120 by means of a ribbon wire 32. The ribbon wire 32 is attached to the battery 116 by means of an adhesive tape 82 embedded with a double sided ribbon wire contact 84 at each end 114 of a standard nicad rechargeable battery or batteries 116 which is then placed inside compartment 120 and electrically connecting the existing battery contacts 118.

Figure 31:
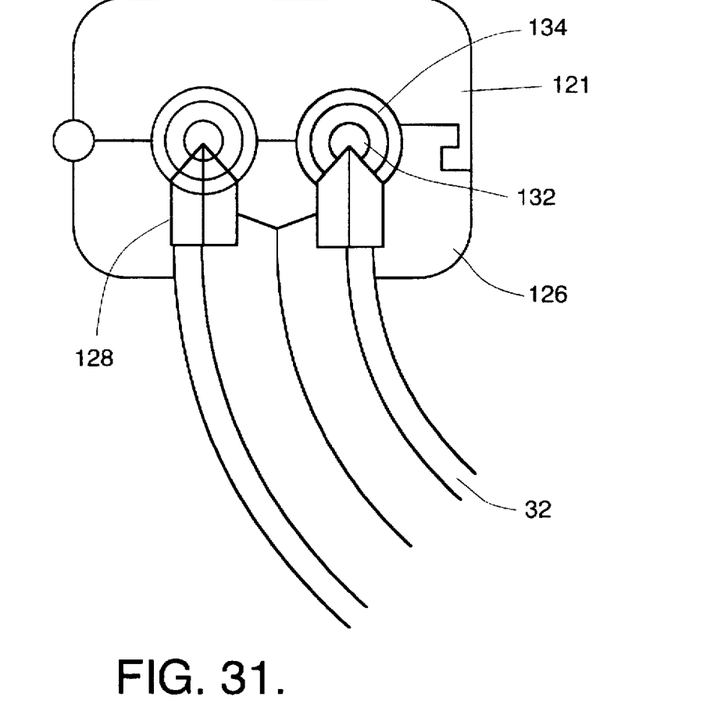
FIGS. 31–36 shows alternative electrical connection embodiments in accordance with the method of the present invention.
Figure 32:
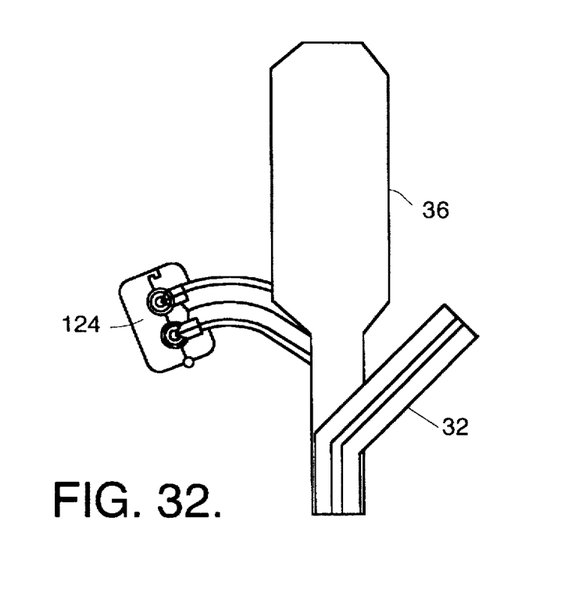
Figure 33:
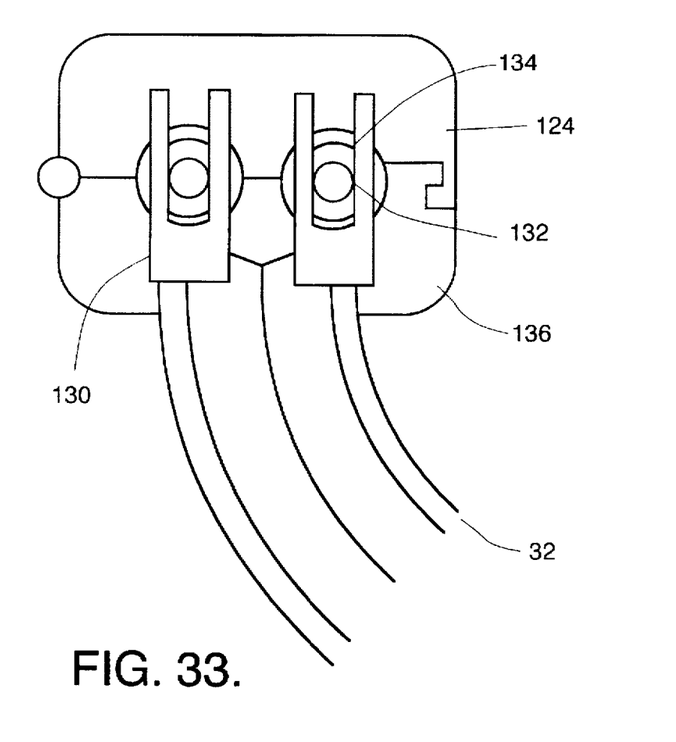
Figure 34:
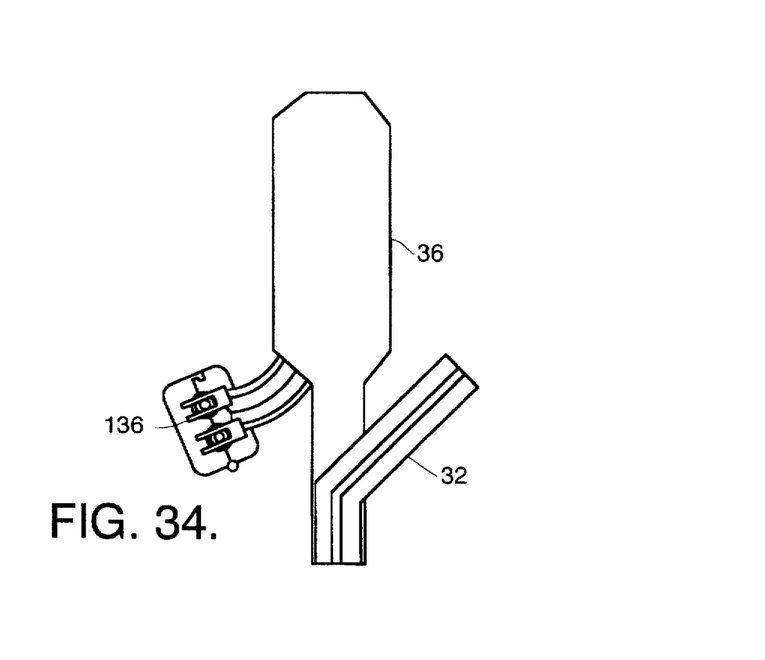
Figure 35:
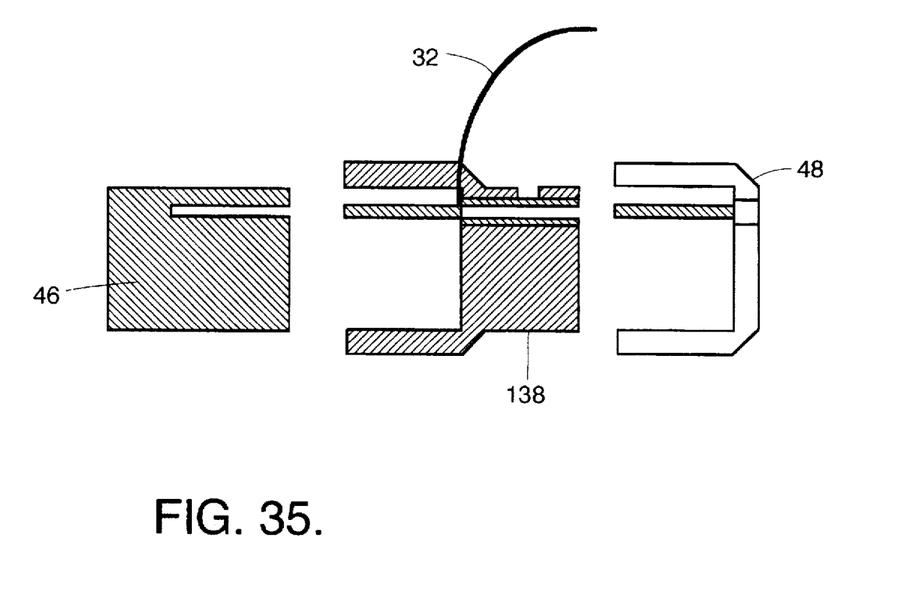
Figure 36:
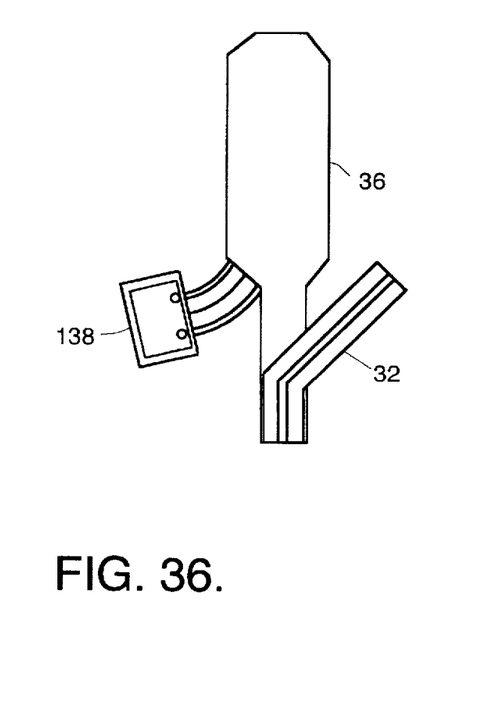

Referring now to FIGS. 31 through 36, in still yet another preferred embodiment there is shown different types of electrical connections in lieu of piercing the ribbon wire 32. FIGS. 31 and 32 show using a wire piercing spade 128 for making a pierce spading connection 124 through standard wire insulation 134 onto a plastic house clip 126. Turning to FIGS. 33 and 34, a similar type of electrical connection is shown instead of the wire piercing spade 128 by utilizing a slice clip connection 136 into a wire slicing slot 130. Additionally, although not shown, it may be envisioned that a standard bayonet plug that plugs into the unit and connects the photo-voltaic cells by the ribbon may be used. Also, all the above-described electrical connection means may use the applicator 36 to assist in the connection. Lastly, FIGS. 35 and 36 shows an electrical connection made through the usage of a male-female plug 138 that inserts between the existing battery plug 46 and battery socket 48.

There has been described and illustrated herein, an improved apparatus which provides a highly efficient and advantageous supplemental charge to any handheld electronic device that is run by rechargeable batteries. It keeps the batteries topped off thus making them last twice as long. Additionally, it has environment advantages in that fewer batteries will end up in landfills. The method and apparatus of the present invention saves energy nationwide by using sunlight instead of fossil fuels to charge communication devices, marine transceivers, digital cameras, handheld GPS units, cellular phones and walkie talkies.

Further, the method and apparatus of the present invention, could be used on children toy cars and trucks both as a retrofit and as a built in photoelectric panel on the roof. Small photoelectric panels could also be attached to battery powered hand tools such as screw drivers and cordless drills especially because new photovoltaic panels are now being marketed that are flexible and can bend around many curvilinear shapes.

While particular embodiments of the invention have been described, it is not intended that the invention be limited exactly thereto, as it is intended that the invention be as broad in scope as the art will permit. The foregoing description and drawings will suggest other embodiments and variations within the scope of the claims to those skilled in the art, all of which are intended to be included in the spirit of the invention as herein set forth.

What is claimed is:

1. An apparatus for providing supplemental photoelectric charge to a battery housed within a communication device comprising:

a frame member having first and second sides;

said first side of said frame member having photoelectric charge means for providing electrical power to the battery;

said photoelectric charge means having electrical connection means for electrically delivering charge from said photoelectric charge means to the battery;

said second side of said frame member having attachment means for attaching said frame member to the communication device; and indicating means housed on said first side of said frame member for indicating if supplemental photoelectric charge is being delivered from said photoelectric charge means to the battery of the communication device wherein said photoelectric charge means provides a trickle supplemental photoelectric charge to the battery housed within the communication device.

2. An apparatus according to claim 1, wherein said photoelectric charge means comprises a plurality of photo-voltaic cells electrically connected in parallel and series; and a ribbon wire electrically connected to said plurality of photo-voltaic cells, said ribbon wire protruding through an aperture located on said second side of said frame member, wherein said ribbon wire is attached onto battery prongs of the battery of the communication device to deliver supplemental photoelectric charge provided by said plurality of said photo-voltaic cells.

3. An apparatus according to claim 1, wherein said second side defines a indentation for housing said attachment means, said attachment means comprising an adhesive material for affixing the frame member to the communication device.

4. An apparatus according to claim 2, wherein said indicating means comprises a light emitting diode electrically connected in series to said plurality of said photo-voltaic cells and to said ribbon wire wherein said light emitting diode light indicates if supplemental photoelectric charge is provided to the battery of the communication device and further functions to prevent current backflow from the battery to ensure that the battery does not discharge when said plurality of said photo-voltaic cells are not in use.

5. An apparatus according to claim 2, wherein said ribbon wire further comprises an applicator having a handle at a first end, said handle sized to be easily handled by a persons fingers, a second end of said applicator defining two oblong holes, sized and configured to fit into a battery plug socket and onto battery socket prongs housed within the communication device and pierce said ribbon wire onto the socket prongs, wherein said ribbon wire being preplaced and affixed to said applicator by an adhesive tape having a pull tag to release said applicator from said ribbon wire after insertion into the communication device.

6. An apparatus according to claim 1, wherein said frame member comprises a cordless phone and said photoelectric charge means comprises a plurality of photo-voltaic cells built into a side of said cordless phone.

7. An apparatus according to claim 1, wherein said frame member comprises a cellular phone battery pack and said photoelectric charge means comprises a plurality of photo-voltaic cells connected to a double sided contact ribbon having an adhesive backing fitting between said cellular phone contacts and battery contacts of said cellular phone.

8. An apparatus according to claim 1, wherein said frame member comprises a handheld marine transceiver unit and said photoelectric charge means comprises a plurality of photo-voltaic cells, said cells located on a plurality of sides of said unit, said attachment means comprises an elastic cover embedded with ribbon contact wires to contact transceivers charge contacts.

9. An apparatus according to claim 1, wherein said frame member comprises a global positioning system and said electrical connection means comprises a bayonet plug for plugging into said global positioning system and connects said photoelectric charge means by a ribbon wire.

10. An apparatus according to claim 1, wherein said frame member comprises a cellular phone battery pack and said photoelectric charge means comprises a plurality of photo-voltaic cells connected to a double sided contact ribbon between battery contacts of said cellular phone batteries.

11. An apparatus according to claim 1, wherein said frame member comprises a cellular phone battery pack and said photoelectric charge means comprises a plurality of photo-voltaic cells connected to battery contacts of said cellular phone battery pack.

12. An apparatus according to claim 1, wherein said frame member comprises a cellular phone and said photoelectric charge means comprises a plurality of photo-voltaic cells built into a side of said cellular phone.

13. An apparatus according to claim 1, wherein said frame member comprises a beeper unit and said photoelectric charge means comprises a plurality of photo-voltaic cells built into a side of said beeper unit.

14. An apparatus according to claim 1, wherein said frame member comprises a marine transceiver unit and said photoelectric charge means comprises a plurality of photo-voltaic cells built into a side of said marine transceiver unit.

* * * * *